Figure 3:
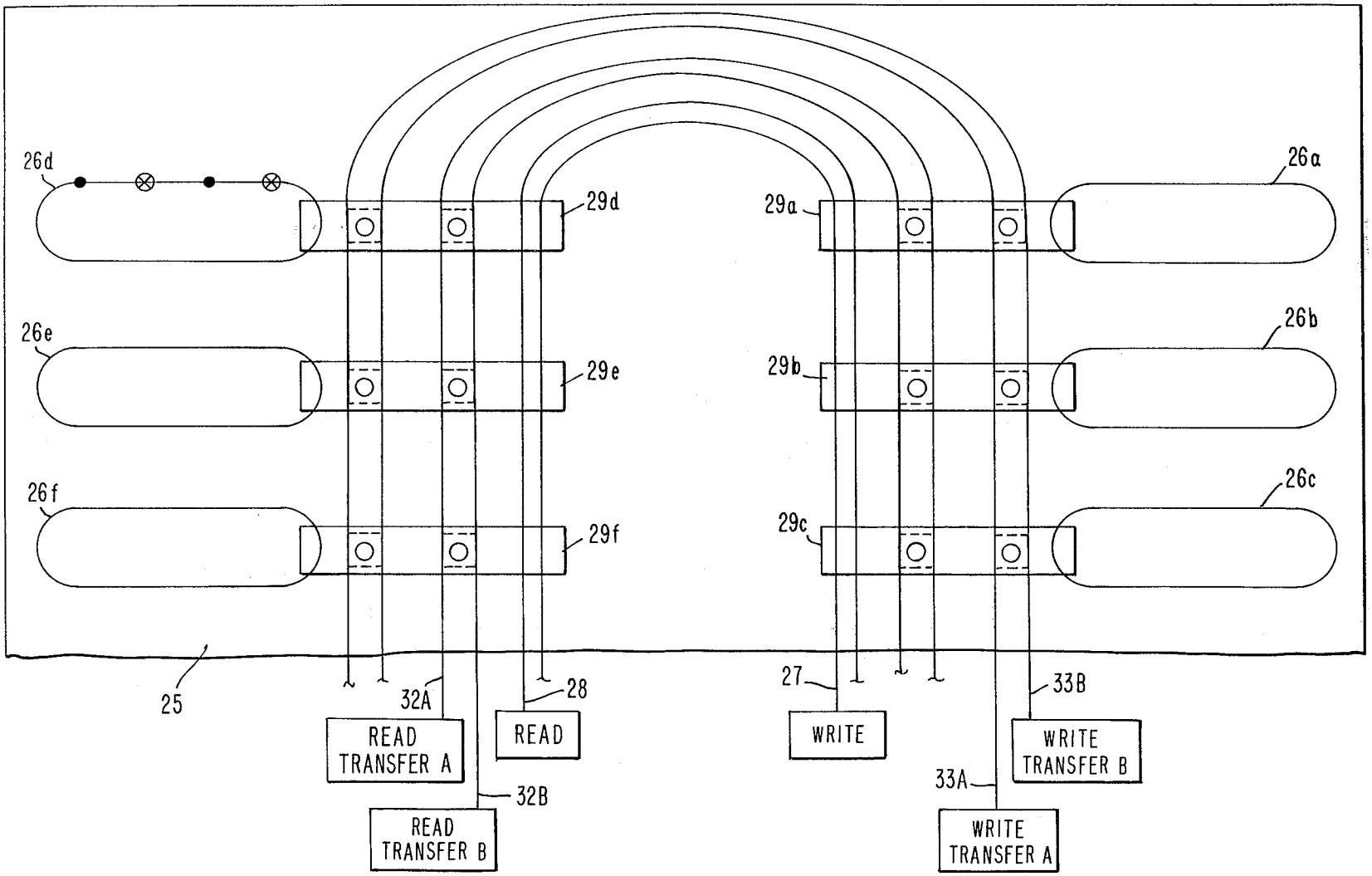

United States Defensive Publication [19] (H) [11] T102,502

Cullum, Jr. [43] Dec. 7, 1982

[54] GAP ELIMINATION IN MEMORY DATA ACCESSION

[76] Inventor: Clifton D. Cullum, Jr., Lincoln Rd., Putnam Valley, N.Y. 10579

[21] Appl. No.: 260,620

[22] Filed: May 5, 1981

Related U.S. Application Data

[63] Continuation of Ser. No. 44,894, Jun. 4, 1979, abandoned, which is a continuation of Ser. No. 877,646, Feb. 14, 1978, abandoned, which is a continuation of Ser. No. 707,394, Jul. 21, 1976, abandoned.

[51] Int. Cl.[3] ..... G11C 19/08

[52] U.S. Cl. ..... 365/16

[57] ABSTRACT

This invention relates to the reduction of gaps in the flow of data accessed in a synchronous serial storage serial communicating data processing memory by the provision of access storage capability at each storage location. The problem to which the invention is directed is the fact that in a synchronously driven array of the type having a number of data storage locations that are accessed by a communicating channel linking all the storage locations in series, the information flow in the communication channel will be limited by the time required for the proper point to be moved around each storage location and the resulting gaps in the data will effect the speed of response. The invention takes the bits to be transferred as they are synchronously propagated around one loop and holds them as the data is synchronously propagated around the other loop until the insertion point arrives. The invention provides a specific size buffer or intermediate storage loop that can hold the amount of data being transferred until the timing is accommodated. The intermediate loop buffer must be big enough for the transferring data but it should not be much larger or there will still be a gap in the data in the communicating loop in proportion to the amount the intermediate loop is oversize.

5 Claims, 2 Sheets Drawing,

15 Pages Specification

The file of this unexamined application may be inspected and copies thereof may be purchased (849 O.G. 1221, Apr. 9, 1968).

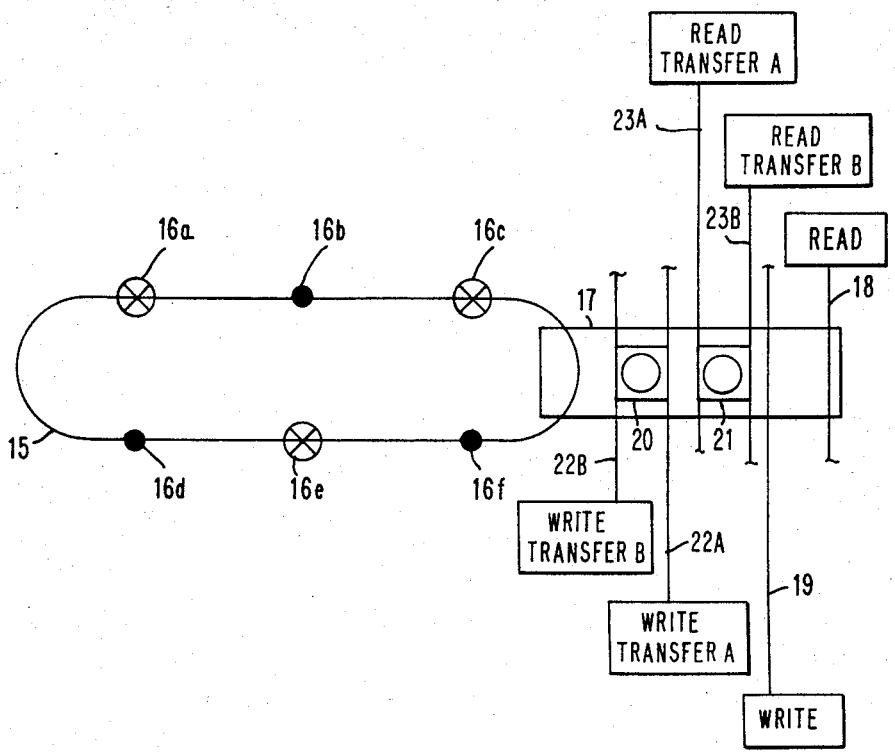

FIG. 1 (PRIOR ART)
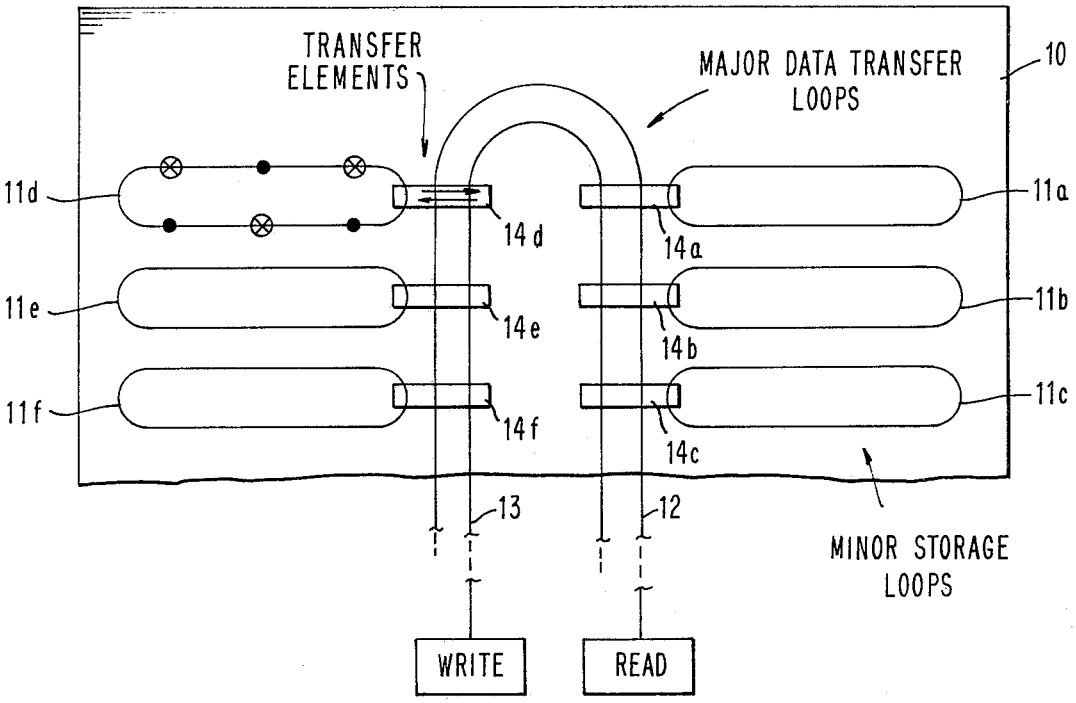
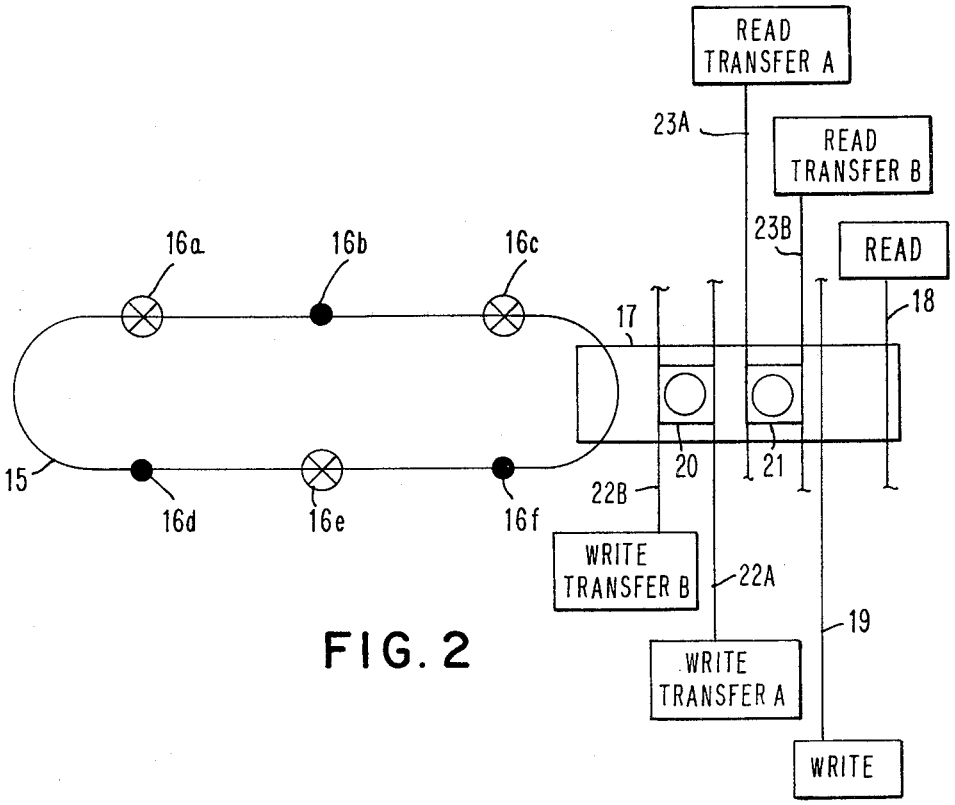
FIG. 2